US012710451B2

(12) United States Patent
Draving

(10) Patent No.: US 12,710,451 B2
(45) Date of Patent: Aug. 18, 2026

(54) METHOD AND SYSTEM FOR PHASE JITTER AND PHASE NOISE MEASUREMENTS USING OSCILLOSCOPES

(71) Applicant: Keysight Technologies, Inc., Santa Rosa, CA (US)

(72) Inventor: Steven Draving, Colorado Springs, CO (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 175 days.

(21) Appl. No.: 18/672,126

(22) Filed: May 23, 2024

(65) Prior Publication Data

US 2025/0362323 A1 Nov. 27, 2025

(51) Int. Cl.
*G01R 13/02* (2006.01)
*G01R 29/26* (2006.01)

(52) U.S. Cl.
CPC ......... *G01R 13/0263* (2013.01); *G01R 29/26* (2013.01)

(58) Field of Classification Search
CPC ............................ G01R 13/0263; G01R 29/26
See application file for complete search history.

(56) References Cited

U.S. PATENT DOCUMENTS 10,018,680 B2 * 7/2018 Kikuchi ......... H03K 19/017509
11,674,993 B2 6/2023 Draving
2011/0267036 A1 * 11/2011 Kharrati ............. G01R 13/0254 324/121 R
2020/0064386 A1 * 2/2020 Draving ................. G01R 19/02
2020/0256893 A1 * 8/2020 Knierim .................... H03L 7/08

FOREIGN PATENT DOCUMENTS

CN 117054715 A 11/2023

OTHER PUBLICATIONS

English translation of CN117054715A, dated Nov. 14, 2023, 13 pgs.
Kyung-Whan Yeom et al., "An Efficient Cross-Correlation Method for a Digital Phase Noise Measurement System," Journal of Electromagnetic Engineering and Science, vol. 22, No. 6, 665~677, Nov. 2022, pp. 665-677.

* cited by examiner

*Primary Examiner* — Lee E Rodak
*Assistant Examiner* — Demetrius R Pretlow

(57) ABSTRACT

A method for measuring the phase jitter and phase noise of a signal-under-test (SUT) includes providing first and second oscilloscopes each having a timebase reference oscillator, the timebase reference oscillator of each of the first and second oscilloscopes configured to generate a timebase reference signal of a given output frequency. The method further comprises phase-locking the timebase reference oscillators of the first and second oscilloscopes together, applying the SUT to an input channel of the first oscilloscope and to an input channel of the second oscilloscope, and generating a first phase jitter measurement of the SUT using the first oscilloscope and generating a second phase jitter measurement of the SUT using the second oscilloscope. The method still further includes obtaining the phase noise of the SUT from the first and second phase jitter measurements to obtain the phase noise of the SUT.

20 Claims, 7 Drawing Sheets

METHOD AND SYSTEM FOR PHASE JITTER AND PHASE NOISE MEASUREMENTS USING OSCILLOSCOPES

FIELD

The present disclosure generally relates to the field of phase noise measurements using oscilloscopes, and more specifically, to methods and systems that improve the accuracy of such measurements by phase-locking the timebases of multiple oscilloscope chassis at a low adjustment update rate.

BACKGROUND

Phase noise is a term used to describe the rapid, minute phase fluctuations of a signal, typically a radio frequency signal. It is a type of noise spectral density that is often measured in dBc/Hz, and is a common specification provided for oscillators and transmitters. Phase noise can be a limiting factor in many systems, including radar and communication systems, as it can degrade the performance of these systems.

The most common instruments used to measure phase noise are the dedicated phase noise measurement systems, called SSAs (Signal Source Analyzers. SSAs use heterodyning to demodulate phase of a carrier in the frequency domain. These measurement systems have the lowest measurement noise floor and are relatively fast. However, they cannot measure data-type signals or spread-spectrum clock-type signals. In addition, their offset frequency range is limited. Newer models can now measure frequency offsets above 1 GHz, but that's still not very high for a 60 GHz clock signal.

Spectrum analyzers are also often used to measure phase noise. Although some SAs (spectrum analyzers) can only discriminate phase noise from amplitude noise over a limited frequency offset range. Most spectrum analyzers simply measure the total single-sideband noise adjacent to the carrier.

Some oscilloscopes can also measure phase noise and they do not have an offset frequency range limitation like SSAs and SAs. Like SSAs, scopes (oscilloscopes) can employ cross-correlation using two copies of the SUT (signal under test) applied to two channels of the scope to "average-out" their internal phase noise measurement floor.

Cross-correlation works by measuring the SUT using two independent measurement circuits. The cross-correlation algorithm then removes differences between the two measurements (un-correlated noise) and retains the similarities (correlated noise). Unfortunately, not all the phase noise measurement floor of two scope channels is uncorrelated. Since scopes (at least all ever manufactured to date) have only a single timebase system to clock their samplers and digitizers, the phase noise of their shared timebase circuitry cannot be removed by cross-correlation. It should be noted here that the reason that all scope channels share a common timebase system is to ensure the best coherency (jitter and skew drift) of multichannel measurements.

SUMMARY

According to an aspect of the inventive concepts, a method for measuring the phase jitter and phase noise of a signal-under-test (SUT) is provided. The method includes providing first and second oscilloscopes each having a timebase reference oscillator, the timebase reference oscillator of each of the first and second oscilloscopes configured to generate a timebase reference signal of a given output frequency. The method further comprises phase-locking the timebase reference oscillators of the first and second oscilloscopes together, applying the SUT to an input channel of the first oscilloscope and to an input channel of the second oscilloscope, and generating a first phase jitter measurement of the SUT using the first oscilloscope and generating a second phase jitter measurement of the SUT using the second oscilloscope. The method still further includes obtaining the phase jitter and phase noise of the SUT from the first and second phase jitter measurements.

The phase jitter and phase noise of the SUT may be obtained by cross-correlating the first and second phase jitter measurements to obtain the cross-correlated phase jitter and phase noise of the SUT. Alternatively, the phase jitter and phase noise of the SUT may be obtained by determining a phase jitter spectrum of the first and second phase jitter measurements, cross-correlating the determined phase jitter spectrums together, and obtaining the phase noise from the cross-correlated phase jitter spectrums.

An adjustment update rate of the phase-locking of the timebase oscillators should be below a lowest intended offset frequency content of the phase jitter and phase noise measurements to take full advantage of the cross-correlation. The adjustment update rate of the phase-locking of the timebase oscillators may be 1 Hz or less.

Phase-locking of the timebase reference oscillators may include outputting a first clock signal from the first oscilloscope synchronized with the timebase reference signal of the first oscilloscope, outputting a second clock signal from the second oscilloscope synchronized with the timebase reference signal of the second oscilloscope, applying the first and second clock signals to respective first and second input channels of the first oscilloscope, determining, at an adjustment rate of the phase locking of the timebase oscillators, a frequency and phase difference between the first and second clock signals applied to the respective first and second input channels of the first oscilloscope, and tuning the output frequency of the timebase reference oscillator of at least one of the first and second oscilloscopes based on the determined frequency and phase difference. The frequency and phase difference may be determined in software resident in the first oscilloscope, or in software resident in an external controller connected to the first oscilloscope.

Each of the first and second oscilloscopes may include a clock input and a clock output configured for ganging together the first and second oscilloscopes, and a phase detector circuit coupled to the clock input and the clock output. In this case, phase-locking the timebase reference oscillators may include applying the clock output of the second oscilloscope to the clock input of the first oscilloscope, using the phase detector of the first oscilloscope to detect a frequency and phase difference between the second clock signal of the second oscilloscope and an internal first clock signal of the first oscilloscope, and tuning an output frequency of the timebase reference oscillator of at least one of the first and second oscilloscopes based on the determined frequency and phase difference. Here, the output of the phase detector may be applied to a field programmable gate array (FPGA) of the first oscilloscope, and the FPGA may be configured to tune the frequency and phase of the timebase reference oscillator of the first oscilloscope based on the output of the phase detector. The FPGA may perform any or all of the phase-locking functions required to lock the two scopes together, including the loop filtering or frequency control.

The first oscilloscope may include a timebase (TB) reference signal input, an analog phase detector circuit selectively connected to the TB reference signal input, and an analog feedback control. In this case, phase-locking the timebase reference oscillators may include applying the timebase reference clock signal of the second oscilloscope to the TB reference signal input of the first oscilloscope, using the analog phase detector to determine a phase difference between the timebase reference clock signal applied to the TB reference signal input and the timebase reference clock signal output by the timebase reference oscillator of the first oscilloscope, and tuning an output frequency of the timebase reference oscillator of the first oscilloscope using the feedback control based on the determined phase difference.

According to another aspect of the inventive concepts, a system for measuring phase jitter and phase noise of a signal-under-test (SUT) is provided. The system includes first and second oscilloscopes each having a timebase reference oscillator, the timebase reference oscillator of each of the first and second oscilloscopes configured to generate a timebase reference signal of a given output frequency. The timebase reference oscillators of the first and second oscilloscopes are phase-locked together, an input channel of the first oscilloscope and to an input channel of the second oscilloscope are each configured to receive the SUT, and the first oscilloscope is configured to generate a first phase jitter measurement of the SUT and the second oscilloscope is configured to generate a second phase jitter measurement of the SUT. The phase jitter and phase noise of the SUT corresponds to a cross-correlation of the first and second phase jitter measurements.

An adjustment update rate of the phase-locking of the timebase oscillators should be below a lowest intended offset frequency content of the phase jitter and phase noise measurements to take full advantage of the cross-correlation. The adjustment update rate of the phase-locking of the timebase oscillators may be 1 Hz or less.

Phase-locking of the timebase reference oscillators of the system may include outputting a first clock signal from the first oscilloscope synchronized with the timebase reference signal of the first oscilloscope, outputting a second clock signal from the second oscilloscope synchronized with the timebase reference signal of the second oscilloscope, applying the first and second clock signals to respective first and second input channels of the first oscilloscope, determining, at an adjustment rate of the phase locking of the timebase oscillators, a frequency and phase difference between the first and second clock signals applied to the respective first and second input channels of the first oscilloscope, and tuning the output frequency of the timebase reference oscillator of at least one of the first and second oscilloscopes based on the determined frequency and phase difference. The frequency and phase difference may be determined in software resident in the first oscilloscope, or in software resident in an external controller connected to the first oscilloscope.

Each of the first and second oscilloscopes of the system may include a clock input and a clock output configured for ganging together the first and second oscilloscopes, and a phase detector circuit coupled to the clock input and the clock output. In this case, phase-locking the timebase reference oscillators may include applying the clock output of the second oscilloscope to the clock input of the first oscilloscope, using the phase detector of the first oscilloscope to detect a frequency and phase difference between the second clock signal of the second oscilloscope and an internal first clock signal of the first oscilloscope, and tuning an output frequency of the timebase reference oscillator of at least one of the first and second oscilloscopes based on the determined frequency and phase difference. Here, the output of the phase detector may be applied to a field programmable gate array (FPGA) of the first oscilloscope, and the FPGA may be configured to tune the frequency and phase of the timebase reference oscillator of the first oscilloscope based on the output of the phase detector. The FPGA may be configured to perform any or all of the phase-locking functions required to lock the two scopes together, including the loop filtering or frequency control.

The first oscilloscope of the system may include a timebase (TB) reference signal input, an analog phase detector circuit selectively connected to the TB reference signal input, and an analog feedback control. In this case, phase-locking the timebase reference oscillators may include applying the timebase reference clock signal of the second oscilloscope to the TB reference signal input of the first oscilloscope, using the analog phase detector to determine a phase difference between the timebase reference clock signal applied to the TB reference signal input and the timebase reference clock signal output by the timebase reference oscillator of the first oscilloscope, and tuning an output frequency of the timebase reference oscillator of the first oscilloscope using the feedback control based on the determined phase difference.

BRIEF DESCRIPTION OF DRAWINGS

The above and other aspects and features of the inventive concepts will become readily apparent from the detailed description that follows, with reference to the accompanying drawings, in which.

DETAILED DESCRIPTION

Figure 1:
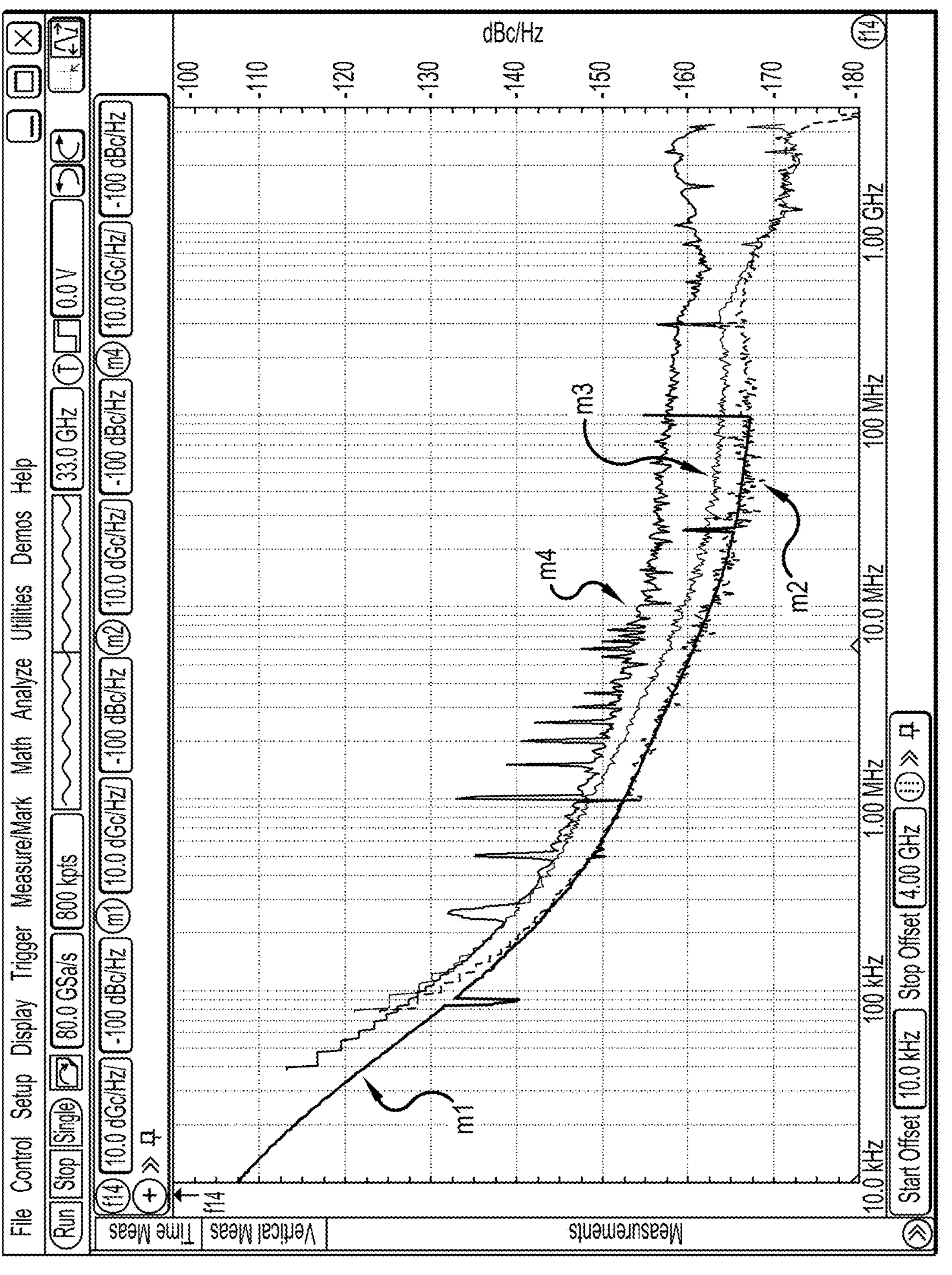
FIG. 1 illustrates a comparison of phase noise measurements using different methods, according to aspects of the present disclosure.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted to avoid obscuring the description of the example embodiments. Such methods and apparatuses are clearly within the scope of the present teachings. Further, throughout the drawings, like reference numbers refer to the same or similar elements.

The terminology used herein is for purposes of describing particular embodiments only, and is not intended to be limiting. The defined terms are in addition to the technical and scientific meanings of the defined terms as commonly understood and accepted in the technical field of the present teachings. As used in the specification and appended claims, the terms 'a', 'an' and 'the' include both singular and plural referents, unless the context clearly dictates otherwise. Thus, for example, 'a device' includes one device and plural devices. Further, for example, when one element is described as being "connected to" another element, the one element may be directly connected to the other element, or indirectly connected to the other element in an operative manner.

Separately, as is traditional in the field of the inventive concepts, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, in the absence of an indication to the contrary, the units and/or modules being implemented by microprocessors or similar may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the example embodiments may be physically separated into two or more interacting and discrete blocks, units and/or modules without departing from the scope of the example embodiments. Conversely, the blocks, units and/or modules of the example embodiments may be physically combined into more complex blocks, units and/or modules without departing from the scope of the example embodiments.

As discussed in the Background section herein, the most common instruments used to measure phase noise are dedicated phase noise measurement systems, called SSAs (Signal Source Analyzers). While accurate, they are limited in offset frequency range and in the types of signals they can measure. As also previously discussed, some oscilloscopes can measure phase noise, but their accuracy is limited by the correlation of their internal measurement noise sources.

In addition, a few scope models include a feature that allows them to be ganged together to form a single scope system with a larger number of coherent channels than that of a single scope instrument. This feature is referred to herein as "Multiscope". Phase noise measurements using two channels located in different chassis of a Multiscope system can improve the cross-correlated measurement floor over that of a single scope instrument. This is because less of the phase noise measurement floor of each channel is correlated with each other. However, much of the phase noise of the two channels is still correlated because they still share most of the same timebase system for coherency reasons. Some scopes, for example, share a common sampling clock (SmpClk) as described below in connection with FIG. 3.

It is possible to phase-lock the timebases of multiple chassis together using, for example, their 10 MHz or 100 MHz Timebase Reference Clocks together (TB Ref of FIG. 3 described below). This helps the cross-correlated phase noise measurement floor quite a bit. The measurement floor in this case becomes the phase noise of the common Timebase Reference Clock they share, which is the reference from one of the scopes or a separate ultra-low phase noise oscillator. Even so, the phase noise measurement floor of this solution is still limited by the separate reference oscillator below the scope's PLL (phase-locked loop) loop-bandwidth of about 100 Hz-10 kHz.

As will be discussed below, the inventive concepts overcome the SSA's limited offset frequency problem by using the scope phase noise measurement method of edge-finding and time-interval error analysis. Further, the inventive concepts overcome the oscilloscope's limited measurement floor problem by phase-locking the timebases of multiple scope chassis in a Multiscope system far below, for example, 1 Hz, un-correlating the phase noise between the two measurement channels below practical phase noise measurement frequency offsets.

Referring to FIG. 1, a comparison of phase noise measurements is illustrated. The comparison includes measurements obtained using a Signal Source Analyzer (SSA), represented by the orange line labeled m1; a single oscilloscope represented by the pink line labeled m4; and a conventional Multiscope represented by the white line labeled m3. Among these, the SSA (m1) is known to provide the most accurate measurement of phase noise.

Also shown in FIG. 1 is a measurement obtained by the methods and systems of the inventive concepts as will be described below. This measurement is represented by the green line labeled m2. It can be seen that the measurement obtained by the inventive concepts (m2) closely correlates to that of the SSA, and represents an improvement of the single scope and Multiscope implementations.

Figure 2:
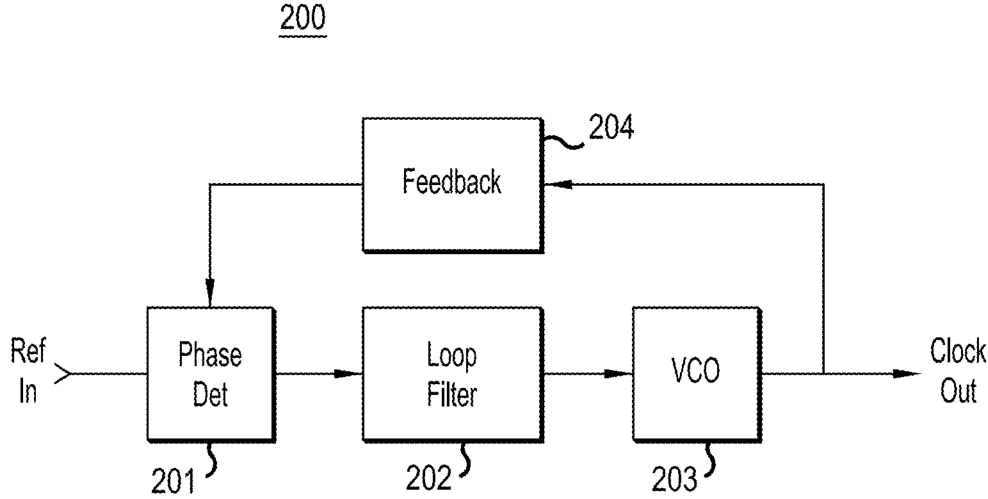
FIG. 2 depicts a basic phase-locked loop (PLL) block diagram, according to aspects of the present disclosure.

Embodiments described herein trade off development time and ease of use and performance. All embodiments use multiple (typically two) scope chassis in a Multiscope configuration with their timebases phase-locked together using a very low frequency loop-bandwidth. All the embodiments also use the Timebase Reference oscillator within one or both scope chassis as the VCO (voltage-controlled oscillator) component of a phase-locked loop (PLL), the basic components of which are shown in FIG. 2. As shown, a PLL 200 generally includes a phase detector 201, a loop filter 202, a voltage-controlled oscillator (VCO) 203 and a feedback path 204 from the VCO 203 output to the phase detector 201.

As mentioned previously, multi-channel oscilloscopes have a single timebase system to clock their samplers and digitizers. An example of this is shown in FIG. 3 discussed next.

Figure 3:
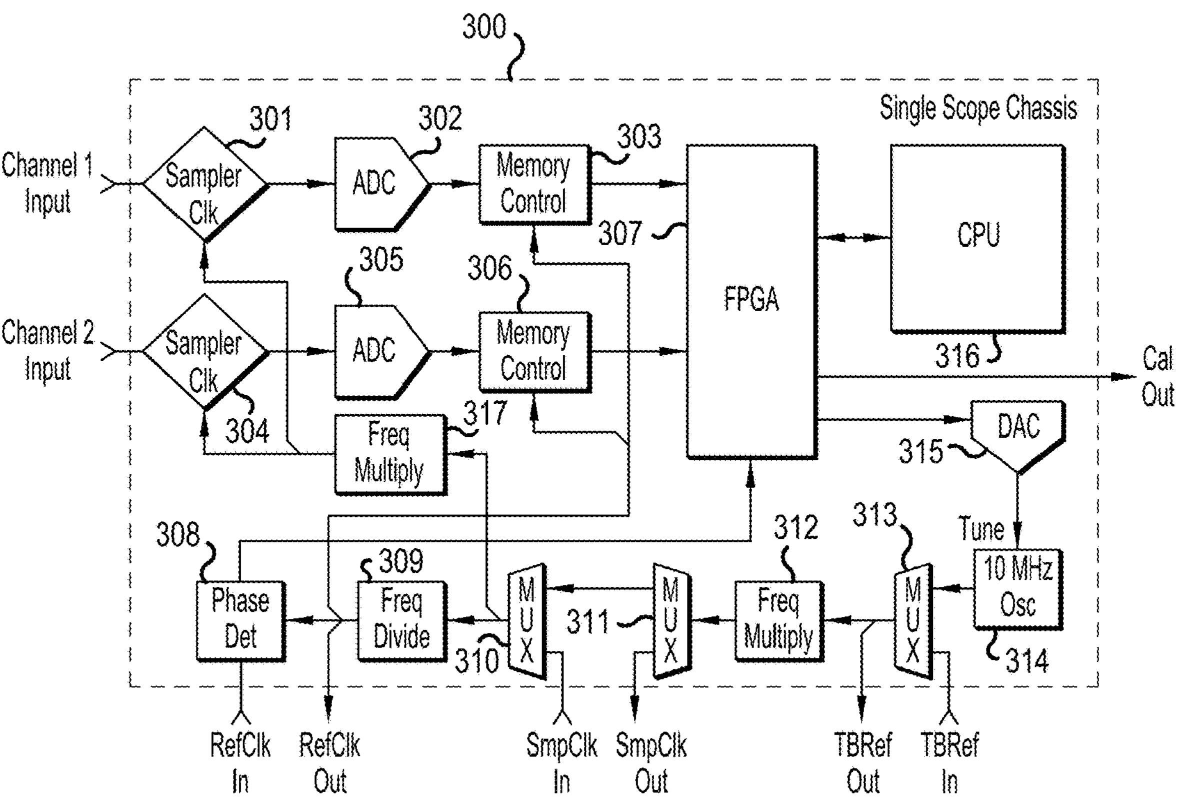
FIG. 3 provides a simplified block diagram of an oscilloscope, according to aspects of the present disclosure.

FIG. 3 is a simplified block diagram of an oscilloscope 300 having multiple channel inputs. Only two input channels (Channel 1 and Channel 2) are shown for simplicity, but it will be understood that the oscilloscope 300 may be equipped with additional input channels. As examples, the oscilloscope 300 may have four, six or eight input channels.

Briefly, each channel includes a sampler 301/304 for sampling an input channel, an analog-to-digital converter (ADC) 302/305 for digitizing the output of the sampler 301/304, and memory control system 303/306 for storing the digitized data generated by the ADC 302/305. The channel outputs are fed to a field-programmable gate array (FPGA) 307 utilized, for example, to implement display triggering at least partially using hardware, while the central processor unit (CPU) controls an overall operation of the oscilloscope 300. The triggering and display operation carried out by FPGA 307 and CPU 316 are well-understood in the art.

The timebase system of the oscilloscope 300 is established by an oscillator 314, which in the illustrated example is a 10 MHz oscillator. The output of the oscillator 314 is referred to herein as a timebase reference signal. In this example, the oscillator 314 is tunable by the FPGA 307 through digital-to-analog converter (DAC) 315. The timebase reference signal output by the oscillator 314 may be processed any number of ways to drive various components of the oscilloscope 300. In the non-limiting and simplified example of FIG. 3, the output of the oscillator is first fed to a multiplexer (MUX) 313. Here, the MUX 313 selectively outputs either the output of the timebase reference signal output by the oscillator 314 or an externally received timebase reference signal (TBRef In). The output of the MUX 313 is applied to a frequency multiplier 312 and may be output externally (TBRef Out). The output of the frequency multiplier 312 constitutes a sampling clock which is applied to a MUX 311. The MUX 311 selectively outputs the sampling clock externally (SmpClk Out) and/or applies the sampling clock to the input of another MUX 310. The sampling clock, whether externally supplied or internally generated, is output from the MUX 310 and applied to a frequency divider 309 and a frequency multiplier 317. The output of the frequency multiplier 317 is used to clock the samplers 301 and 304. The output of the frequency divider 309 is a reference clock signal that is used to drive memory control systems 303 and 306, and which may be externally output (RefClK Out). In addition, in this example, a phase detector 308 is provided to compare a phase of the reference clock signal with the phase of an externally supplied reference clock signal (RefClk In). As shown, the output of the phase detector 308 may be applied to the FPGA 307.

Embodiments herein are generally characterized by providing at least two oscilloscopes each having a timebase reference oscillator, and phase-locking the timebase reference oscillators of the first and second oscilloscopes together. The manner of phase-locking the timebase reference oscillators is not limited, and indeed, the embodiments described below achieve phase-locking in different manners. A signal under test (SUT) is applied to input channels of the two oscilloscopes, and phase jitter measurements are obtained for each. The separate phase jitter measurements are then cross-correlated to obtain the phase noise of the SUT. The update rate of the phase-locking of the timebase oscillators determines the lowest frequency content of the phase jitter and phase noise measurements. So, the update rate should be chosen sufficiently low enough to contain all of the desired phase noise content in the SUT. For example, an adjustment update rate of the phase-locking of the timebase oscillators may be 1 Hz or less.

In some embodiments, obtaining the phase jitter and phase noise of the SUT includes cross-correlating the first and second phase jitter measurements to obtain the cross-correlated phase jitter and phase noise of the SUT. In this case, cross-correlating the phase jitter takes place prior to computing the phase noise of the SUT. In alternative embodiments, the phase jitter spectrum is computed prior to cross-correlating the two jitter spectrums together prior to computing the phase noise. The order in which the jitter spectrum is computed, or the cross-correlation is performed does not change the phase noise result.

This description also refers to phase jitter as both a final result as well as an intermediate result in the process of computing phase noise. It should be noted that time jitter, also sometimes referred to as time-interval error is equivalent to phase jitter, simply expressed in different units, and therefore not unique to the inventive concepts described or claimed herein.

Figure 4:
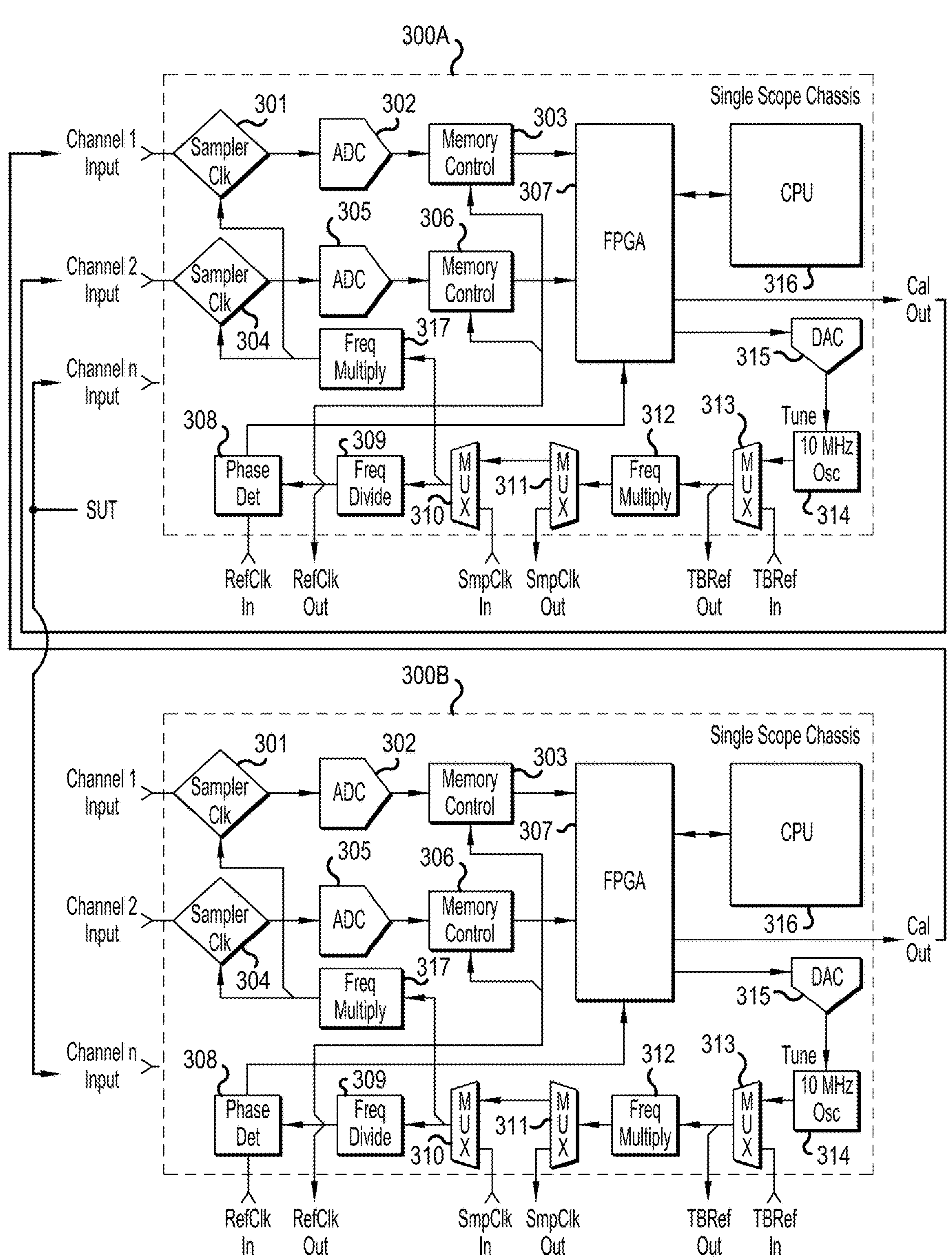
FIG. 4 is a circuit block diagram for reference in describing a method and system for measuring the phase jitter and phase noise of a signal under test (SUT) according to an embodiment of the inventive concepts.

FIG. 4 is a circuit block diagram for reference in describing an embodiment of the inventive concepts. This embodiment may be preferred when improved measurement performance is required as soon as possible. Further, the embodiment may be implemented without any HW (hardware) or FW (firmware) changes to the oscilloscope instruments.

Referring to FIG. 4, a first oscilloscope 300A and a second oscilloscope 300B are provided. It is assumed here that each oscilloscope 300A and 300B is configured in the same manner as the oscilloscope 300 described above in connection with FIG. 3. However, the embodiments are not limited to the example of FIG. 3.

Each oscilloscope 300A and 300B includes a timebase reference oscillator 314 generating a timebase reference signal of a given output frequency. In the example of the present embodiments, the output frequency is 10 MHz, but the inventive concepts are not limited thereto.

In this embodiment, phase-locking of the timebase reference oscillators is achieved by outputting a first clock signal (e.g., a calibrator signal Cal Out) from the first oscilloscope 300A that is synchronized with the timebase reference signal of the first oscilloscope 300A, and outputting a second clock signal (e.g., another calibrator signal Cal Out) from the second oscilloscope 300B that is synchronized with the timebase reference signal of the second oscilloscope 300B. These clock signals may be output by the FPGAs 307 as shown in the FIG. 4, but the embodiment is not limited in this manner. That is, the scopes 300A and 300B may have many different clock signals that can be used for the purposes of this embodiment, provided they are synchronous with the timebase reference clock signal.

Still referring to FIG. 4, the first and second clock signals are applied to respective first and second input channels of the first oscilloscope 300A. Here, the phase detector, loop filter and VCO adjustments are implemented in software resident in the first oscilloscope 300A (i.e., running on the scope's application software), or resident in an external controller connected to the first oscilloscope 300A (running in an external controller software like MATLAB). Indeed, the second oscilloscope can even act as an external controller. Wherever it is running, it does so in a loop while also measuring phase jitter and phase noise. If using Multiscope, the scope application could measure the jitter and phase noise. The PLL algorithm measures the phase between the clock signals connected to the channel inputs and then adjusts the VCO's frequency tune control. That is, the output frequency of the timebase reference oscillator of at least one of the first and second oscilloscopes is tuned based on the determined frequency and phase difference. This is done at a given adjustment rate of the PLL which should be below a lowest intended offset frequency of the jitter and phase noise measurements. For example, the adjustment rate may be 1 Hz or less.

In the meantime, the signal under test (SUT) is applied to another input channel (Channel n) of each of the first and second oscilloscopes 300A and 300B where respective phase jitter measurements of the SUT are obtained from each scope. The phase jitter measurements are then cross-correlated using well-known cross-correlation algorithms to obtain the phase noise of the SUT. The cross-correlation may, for example, be carried out by an external controller (such as MATLAB) or by a Multiscope application.

Figure 5:
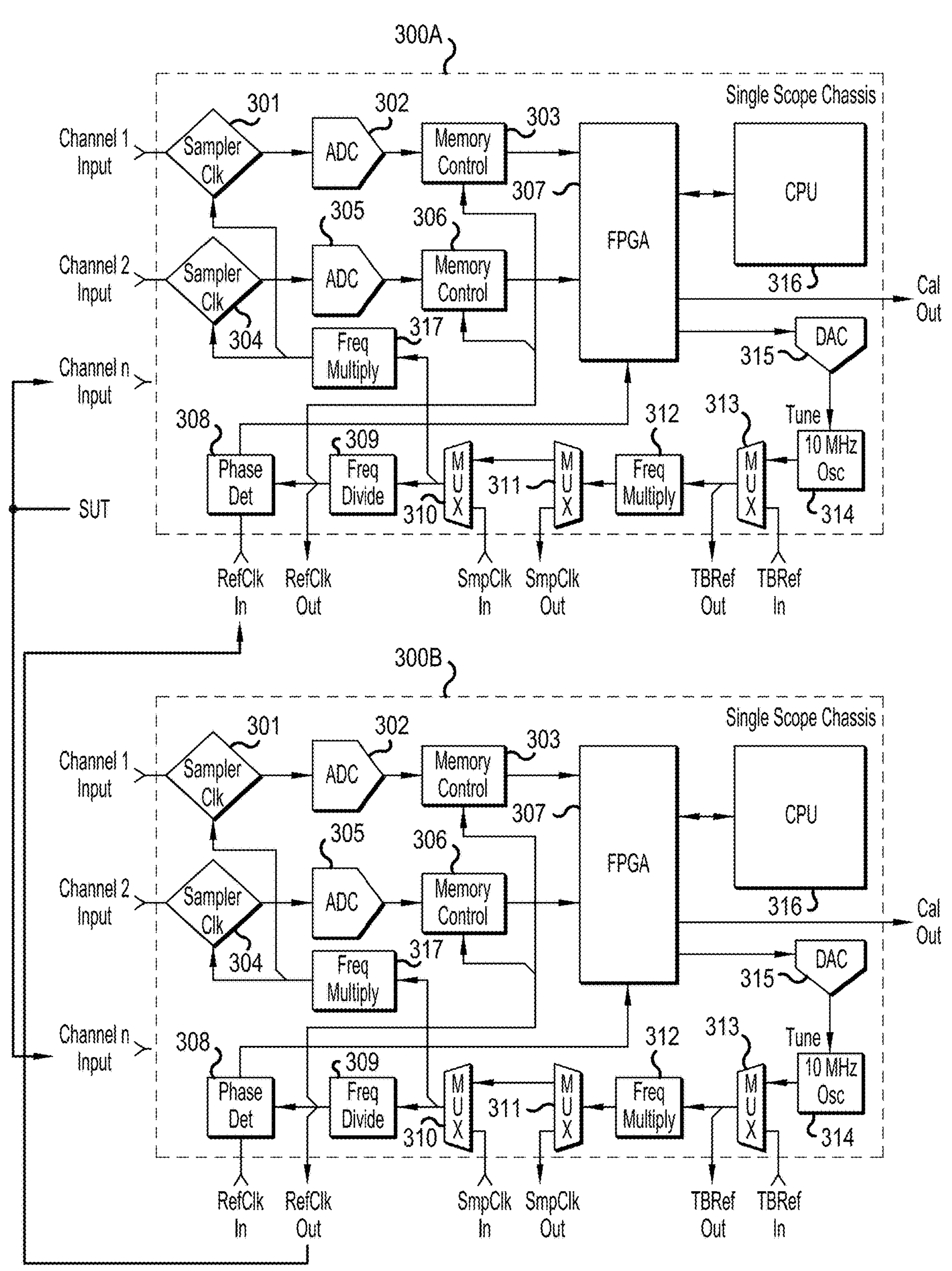
FIG. 5 is a circuit block diagram for reference in describing a method and system for measuring the phase jitter and phase noise of a SUT according to another embodiment of the inventive concepts.

FIG. 5 is a circuit block diagram for reference in describing another embodiment of the inventive concepts. This second embodiment could be implemented with only FW changes to existing oscilloscope instruments, this would significantly simplify the scope SW (software) application. It eliminates the need for the calibrator-to-channel-inputs connections by using the existing RefClk connection required for Multiscope.

As with the previous embodiment, a first oscilloscope 300A and a second oscilloscope 300B are provided. It is assumed here that each oscilloscope 300A and 300B is configured in the same manner as the oscilloscope 300 described above in connection with FIG. 3. However, the embodiments are not limited to the example of FIG. 3.

As discussed previously, each of the first and second oscilloscopes 300A and 300B includes a reference clock input (RefClk In) and a reference clock output (RefClk Out) which may be used when ganging together the first and second oscilloscopes 300A and 300B. In the example of FIG. 5, the reference clock output of the second oscilloscope 300B is applied to the reference clock input of the first oscilloscope 300A, and the phase detector 308 of the first oscilloscope used to detect a frequency and phase difference between the reference clock signal of the second oscilloscope 300B and an internal reference clock signal of the first oscilloscope 300A. In this embodiment, an output of the phase detector 308 is applied to the FPGA 307 of the first oscilloscope 300A, and the FPGA is configured to tune the frequency and phase of the timebase reference oscillator 314 of the first oscilloscope 300A based on the output of the phase detector 308.

As with the previous embodiment, during phase-locking of the timebase systems as described above, the signal under test (SUT) is applied to an input channel (Channel n) of each of the first and second oscilloscopes 300A and 300B where respective phase jitter measurements of the SUT are obtained from each scope. As before, the phase jitter measurements are then cross-correlated using well-known cross-correlation algorithms to obtain the phase noise of the SUT. The cross-correlation may, for example, be carried out by an external controller (such as MATLAB) or by a Multiscope application.

The embodiment of FIG. 5 controls the PLL using the FPGA 307. Some high-performance scopes already have a phase detector circuit 308 for use in Multiscope applications and is only used during calibrations, so it is otherwise free to use. Future scopes could route a copy of the external RefClk In directly to the FPGA 307. That would aid with the initial lock acquisition. In fact, the FPGA 307 could also be used to perform the PLL's phase detection function if desired.

Figure 6:
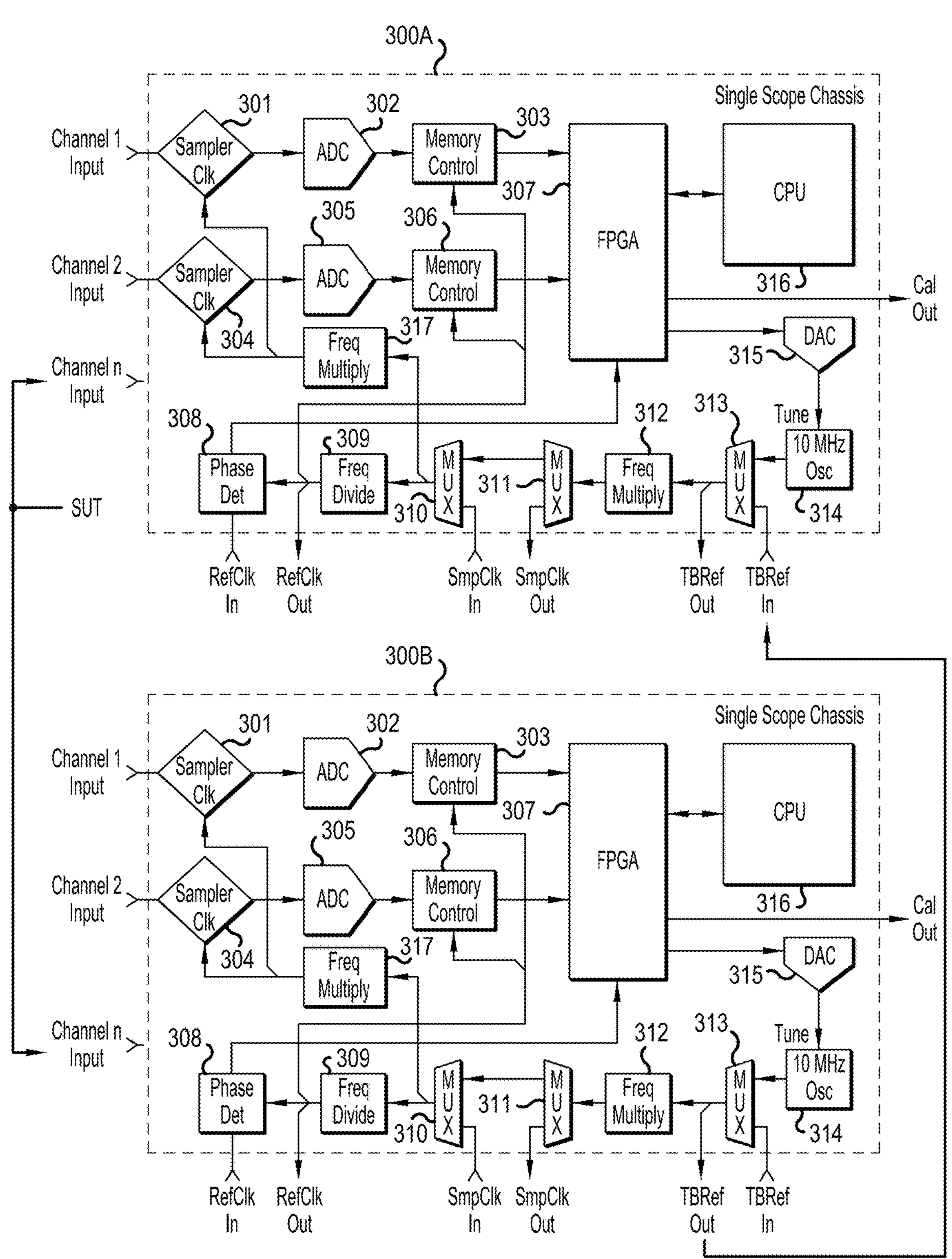
FIGS. 6 and 7 are circuit block diagrams for reference in describing a method and system for measuring the phase jitter and phase noise of a SUT according to still another embodiment of the inventive concepts.
Figure 7:
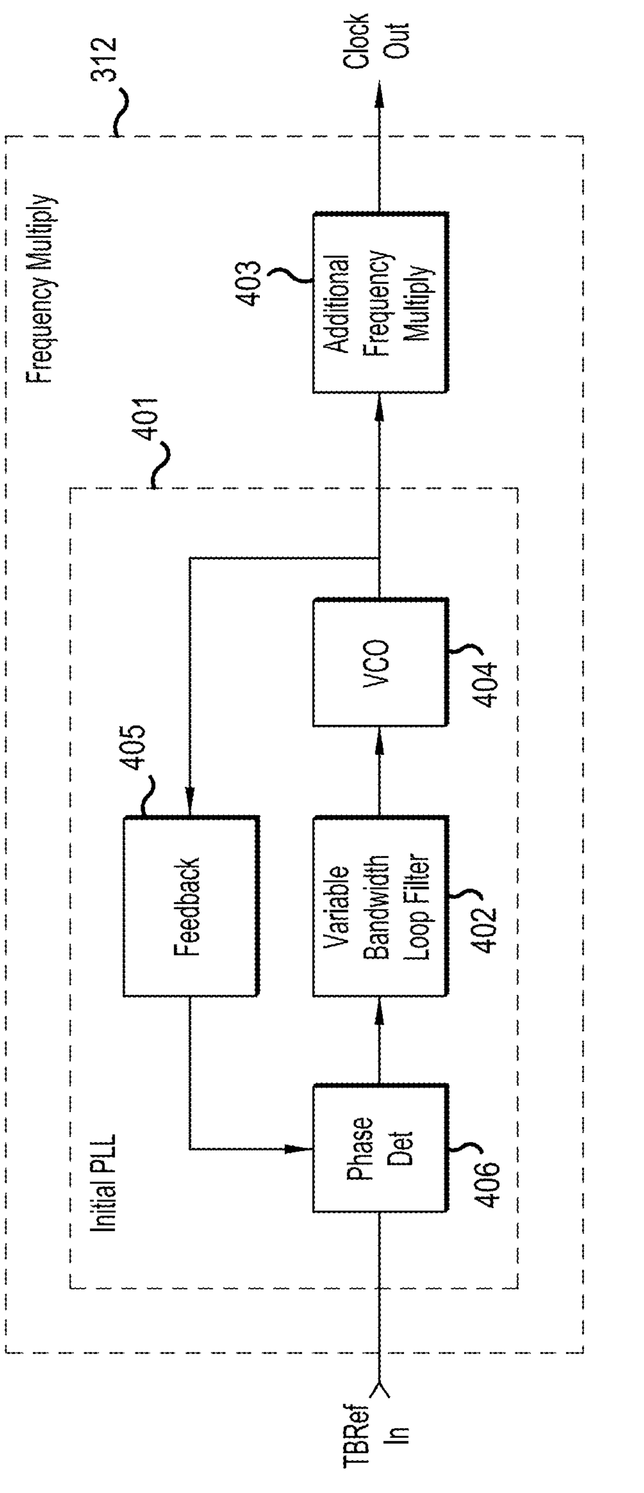

FIGS. 6 and 7 are circuit block diagrams for reference in describing yet another embodiment of the inventive concepts.

In this embodiment, at least one of the oscilloscopes (300A in this example) is equipped with a timebase clock PLL employing a variable bandwidth loop filter. FIG. 7 illustrates the frequency multiplier 312 of the scope 300A of FIG. 6 as comprised of a first PLL 401 followed by additional frequency multiplication 403. The first PLL 401 includes the VCO 404, a feedback path 405 and a phase detector circuit 406. In addition, in this embodiment, a variable bandwidth loop filter 402 is within the first PLL 401. The purpose of this variable bandwidth loop filter 402 is to allow an oscilloscope system to phase-lock using an ultra-low loop bandwidth for cross-correlated jitter and phase noise measurements. Of course an oscilloscope could simply use an ultra-low loop bandwidth all the time, but switching between different bandwidths permits optimizing the loop filter for other applications. Here, as shown in FIG. 6, the timebase reference output (TBRef Out) signal from the second oscilloscope is applied to the timebase reference signal input (TBRef In) port of the first oscilloscope 300A.

And, as with the previous embodiments, during phase-locking of the timebase systems using ultra-low bandwidth loop filter 402, the signal under test (SUT) is applied to an input channel (Channel n) of each of the first and second oscilloscopes 300A and 300B where respective phase jitter measurements of the SUT are obtained from each scope. As before, the phase jitter measurements are then cross-correlated using well-known cross-correlation algorithms to obtain the phase noise of the SUT. The cross-correlation may, for example, be carried out by an external controller (such as MATLAB).

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. While representative embodiments are disclosed herein, one of ordinary skill in the art will appreciate that many variations that are in accordance with the present teachings are possible and remain within the scope of the appended claim set. The invention therefore is not to be restricted except within the scope of the appended claims.

What is claimed is:

1. A method for measuring the phase jitter and phase noise of a signal-under-test (SUT), comprising:
- providing first and second oscilloscopes each having a timebase reference oscillator, the timebase reference oscillator of each of the first and second oscilloscopes configured to generate a timebase reference signal of a given output frequency;
- phase-locking the timebase reference oscillators of the first and second oscilloscopes together;
- applying the SUT to an input channel of the first oscilloscope and to an input channel of the second oscilloscope;
- generating a first phase jitter measurement of the SUT using the first oscilloscope and generating a second phase jitter measurement of the SUT using the second oscilloscope; and
- obtaining the phase jitter and phase noise of the SUT from the first and second phase jitter measurements,
- wherein an adjustment update rate of the phase-locking of the timebase oscillators is below a lowest intended offset frequency content of the phase jitter and phase noise measurements.

2. The method of claim 1, wherein obtaining the phase jitter and phase noise of the SUT comprises cross-correlating the first and second phase jitter measurements to obtain the cross-correlated phase jitter and phase noise of the SUT.

3. The method of claim 1, wherein obtaining the phase jitter and phase noise of the SUT comprises determining a phase jitter spectrum of the first and second phase jitter measurements, cross-correlating the determined phase jitter spectrums together, and obtaining the phase noise from the cross-correlated phase jitter spectrums.

4. The method of claim 1, wherein an adjustment update rate of the phase-locking of the timebase oscillators is 1 Hz or less.

5. The method of claim 1, wherein phase-locking of the timebase reference oscillators includes:

outputting a first clock signal from the first oscilloscope synchronized with the timebase reference signal of the first oscilloscope;

outputting a second clock signal from the second oscilloscope synchronized with the timebase reference signal of the second oscilloscope;

applying the first and second clock signals to respective first and second input channels of the first oscilloscope;

determining, at an adjustment rate of the phase locking of the timebase oscillators, a frequency and phase difference between the first and second clock signals applied to the respective first and second input channels of the first oscilloscope; and tuning the output frequency of the timebase reference oscillator of at least one of the first and second oscilloscopes based on the determined frequency and phase difference.

6. The method of claim 5, wherein the frequency and phase difference is determined in software resident in the first oscilloscope.

7. The method of claim 5, wherein the frequency and phase difference is determined in software resident in an external controller connected to the first oscilloscope.

8. The method of claim 1, wherein each of the first and second oscilloscopes includes a clock input and a clock output configured for ganging together the first and second oscilloscopes, and a phase detector circuit coupled to the clock input and the clock output, and wherein phase-locking the timebase reference oscillators includes:

applying the clock output of the second oscilloscope to the clock input of the first oscilloscope;

using the phase detector circuit of the first oscilloscope to detect a frequency and phase difference between the second clock signal of the second oscilloscope and an internal first clock signal of the first oscilloscope; and tuning an output frequency of the timebase reference oscillator of at least one of the first and second oscilloscopes based on the determined frequency and phase difference, wherein the first clock signal is synchronized with the timebase reference signal output by the timebase reference oscillator of the first oscilloscope, and the second clock signal is synchronized with the timebase reference clock signal output by the timebase reference oscillator of the second oscilloscope.

9. The method of claim 8, wherein at least one of the phase detection, loop filtering or frequency control of the effective phase-locked loop is implemented using a field programmable gate array (FPGA) of the first oscilloscope.

10. The method of claim 1, wherein the first oscilloscope includes a timebase (TB) reference signal input, an analog phase detector selectively connected to TB reference signal input, and an analog feedback control, wherein phase-locking the timebase reference oscillators includes:

applying the timebase reference clock signal of the second oscilloscope to the TB reference signal input of the first oscilloscope;

using the analog phase detector to determine a phase difference between the timebase reference clock signal applied to the TB reference signal input and the timebase reference clock signal output by the timebase reference oscillator of the first oscilloscope; and tuning an output frequency of the timebase reference oscillator of the first oscilloscope using the feedback control based on the determined phase difference.

11. A system for measuring the phase jitter and phase noise of a signal-under-test (SUT), the system comprising:

first and second oscilloscopes each having a timebase reference oscillator, the timebase reference oscillator of each of the first and second oscilloscopes configured to generate a timebase reference signal of a given output frequency;

wherein the timebase reference oscillators of the first and second oscilloscopes are phase-locked together;

wherein an input channel of the first oscilloscope and to an input channel of the second oscilloscope are each configured to receive the SUT;

wherein the first oscilloscope is configured to generate a first phase jitter measurement of the SUT and the second oscilloscope is configured to generate a second phase jitter measurement of the SUT; and wherein the phase jitter and phase noise of the SUT corresponds to a cross-correlation of the first and second phase jitter measurements.

12. The system of claim 11, wherein an adjustment update rate of the phase-locked timebase oscillators is below a lowest intended offset frequency content of the phase jitter and phase noise measurements.

13. The system of claim 11, wherein an adjustment update rate of the phase-locked timebase oscillators is 1 Hz or less.

14. The system of claim 11, wherein phase-locking of the timebase reference oscillators includes:

wherein the first oscilloscope is configured to output a first clock signal synchronized with the timebase reference signal of the first oscilloscope;

wherein the second oscilloscope is configured to output a second clock signal synchronized with the timebase reference signal of the second oscilloscope;

wherein the first and second clock signals are applied to respective first and second input channels of the first oscilloscope;

wherein the system includes software configured to determine, at an adjustment rate of the phase locking of the timebase oscillators, a frequency and phase difference between the first and second clock signals applied to the respective first and second input channels of the first oscilloscope; and and wherein the output frequency of the timebase reference oscillator of at least one of the first and second oscilloscopes is tuned based on the determined frequency and phase difference.

15. The system of claim 14, wherein the software is resident in the first oscilloscope.

16. The system of claim 14, wherein the software resident in an external controller connected to the first oscilloscope.

17. The system of claim 11, wherein each of the first and second oscilloscopes includes a clock input and a clock output configured for ganging together the first and second oscilloscopes, and a phase detector circuit coupled to the clock input and the clock output, and wherein the clock output of the second oscilloscope is applied to the clock input of the first oscilloscope;

wherein the phase detector circuit of the first oscilloscope is configured to detect a frequency and phase difference between the second clock signal of the second oscilloscope and an internal first clock signal of the first oscilloscope; and wherein an output frequency of the timebase reference oscillator of at least one of the first and second oscilloscopes is tuned based on the determined frequency and phase difference.

18. The system of claim 11, wherein at least one of the phase detection, loop filtering or frequency control of the effective phase-locked loop are implemented within a field programmable gate array (FPGA) of the first oscilloscope.

19. The system of claim 11, wherein the first oscilloscope includes a timebase (TB) reference signal input, an analog phase detector selectively connected to TB reference signal input, and an analog feedback control, wherein the timebase reference clock signal of the second oscilloscope is applied to the TB reference signal input of the first oscilloscope;

wherein the analog phase detector is configured to determine a phase difference between the timebase reference clock signal applied to the TB reference signal input and the timebase reference clock signal output by the timebase reference oscillator of the first oscilloscope; and wherein an output frequency of the timebase reference oscillator of the first oscilloscope is tuned using the analog feedback control based on the determined phase difference.

20. A method for measuring the phase jitter and phase noise of a signal-under-test (SUT), comprising:

providing first and second oscilloscopes each having a timebase reference oscillator, the timebase reference oscillator of each of the first and second oscilloscopes configured to generate a timebase reference signal of a given output frequency;

phase-locking the timebase reference oscillators of the first and second oscilloscopes together;

applying the SUT to an input channel of the first oscilloscope and to an input channel of the second oscilloscope;

generating a first phase jitter measurement of the SUT using the first oscilloscope and generating a second phase jitter measurement of the SUT using the second oscilloscope; and obtaining the phase jitter and phase noise of the SUT from the first and second phase jitter measurements, wherein obtaining the phase jitter and phase noise of the SUT comprises cross-correlating the first and second phase jitter measurements to obtain the cross-correlated phase jitter and phase noise of the SUT.

* * * * *